(12) United States Patent
Hwang

(10) Patent No.: US 7,732,746 B2
(45) Date of Patent: Jun. 8, 2010

(54) IMAGE SENSOR AND METHOD OF FABRICATING THE SAME

(75) Inventor: Joon Hwang, Chungjoo-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1 day.

(21) Appl. No.: 12/241,693

(22) Filed: Sep. 30, 2008

(65) Prior Publication Data

US 2009/0026357 A1  Jan. 29, 2009

Related U.S. Application Data

(62) Division of application No. 11/320,902, filed on Dec. 30, 2005, now Pat. No. 7,445,950.

(30) Foreign Application Priority Data

Dec. 30, 2004  (KR) .................. 10-2004-0117224

(51) Int. Cl.
*H01L 31/0232* (2006.01)

(52) U.S. Cl. .............. 250/208.1; 250/226; 250/227.2; 257/E31.121; 257/E27.134; 257/290; 438/48; 438/57; 438/758

(58) Field of Classification Search .......... 250/208.1, 250/226, 227.2; 257/E31.121, E27.134, 257/290–294; 438/48, 57, 758

See application file for complete search history.

(56) References Cited

U.S. PATENT DOCUMENTS

| 6,081,018 | A | 6/2000 | Nakashiba et al. | |
| 6,242,730 | B1 | 6/2001 | Lin et al. | |
| 6,656,762 | B2 * | 12/2003 | Kim .......................... | 438/70 |
| 6,660,624 | B2 | 12/2003 | Tzeng et al. | |
| 2004/0147059 | A1 * | 7/2004 | Jeong et al. .................. | 438/70 |

FOREIGN PATENT DOCUMENTS

KR  10-2000-0003929  1/2000

OTHER PUBLICATIONS

Office Action from the Korean Intellectual Property Office, dated Apr. 28, 2006, in related Korean Patent Application No. 10-2004-0117224.

* cited by examiner

*Primary Examiner*—Seung C Sohn
(74) *Attorney, Agent, or Firm*—Finnegan, Henderson, Farabow, Garrett & Dunner, L.L.P.

(57) ABSTRACT

Provided is an image sensor including an overcoating layer and at least two micro lenses formed on the overcoating layer. The image sensor is characterized in that the overcoating layer positioned below a clearance between the micro lenses is etched such that curved surfaces of the micro lenses extend to the etched overcoating layer, and a contamination in the bonding pad can be prevented.

3 Claims, 4 Drawing Sheets

IMAGE SENSOR AND METHOD OF FABRICATING THE SAME

This application is a divisional application of U.S. patent application Ser. No. 11/320,902 filed on Dec. 30, 2005 now U.S. Pat. No. 7,445,950, which is based on and claims priority to Korean Patent Application No. 10-2004-0117224, filed Dec. 30, 2004. The entire contents of these applications are incorporated herein by reference in their entirety.

BACKGROUND OF THE INVENTION

1. Field of the Invention

The present invention relates to an image sensor and method of fabricating the same, and more particularly, to an image sensor provided with a bonding pad that can be prevented from being eroded by a developer, and a micro lens with an improved concentration efficiency, and a method of fabricating the same.

2. Description of the Related Art

In general, image sensors are a semiconductor device, which converts an optical image into an electrical signal, and are classified into charge coupled device (CCD) type image sensors and complementary metal oxide semiconductor (CMOS) type image sensors. The CMOS type image sensor is generally abbreviated as 'CIS'.

The CCD type image sensors and the CMOS type image sensors commonly have a light receiver that receives light and converts the received light into an electrical signal. The CCD type image sensors transmits the electrical signal through a CCD and converts the electrical signal into a voltage at their last terminal, whilst the CMOS type image sensors convert the electrical signal into a voltage at each pixel and output the converted voltage to an outside.

In the meanwhile, light passes through a multi-layer consisting of a micro lens, a color filter and a light shielding layer before it is incident into the image sensor and reaches the light receiver. This multi-layer is an element to improve the picture quality or reproduce colors, and needs to be optimized so as to realize good picture quality.

Hereinafter, a related art image sensor will be described with reference to FIG. 1.

FIG. 1 is a schematic sectional view of an image sensor 100 according to the related art, and omits a photodiode and the like.

The related art image sensor 100 is configured to include a substrate 1, an element layer 2 formed on the substrate 1, a bonding pad 4 formed on a bonding pad area 12 of the element layer 2, a passivation layer 3 covering the bonding pad 4 and formed on the element layer 2, color filter patterns 6, 7, 8 sequentially formed on a pixel array area 11 of the passivation layer 3, an overcoating layer (OCR) 9 formed on the color patterns 6, 7, 8, and a micro lens 21 formed on the OCR 9.

According to the related art, the passivation layer 3 is etched to open the bonding pad 4, and then consecutive photomask process steps are performed to form the color filter patterns 6, 7, 9, the OCR 9, and the micro lens 21. The bonding pad 4 is generally made of aluminum (Al).

Then, the alkaline developer used for developing photoresist films in the consecutive photomask process steps hardens the bonding pad made of pure Al, and may sometimes cause a contaminant 30 to be created on the bonding pad 4.

Also, the hardening and the contamination of the bonding pad 4 cause function fail or the like due to pin contact failure during the probing test. At this time, deep probing is only a method.

In addition, as shown in FIG. 1, in the prior art image sensor 100, a clearance 22 between the micro lenses 21 is generated to deteriorate the concentration efficiency since light that is incident into the clearance 22 is not induced into the photodiode.

SUMMARY OF THE INVENTION

Accordingly, the present invention is directed to an image sensor and method of fabricating the same that substantially obviates one or more problems due to limitations and disadvantages of the related art.

An object of the present invention is to provide an image sensor provided with a bonding pad that can be prevented from being eroded by a developer, and a micro lens with an improved concentration efficiency, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of fabricating an image sensor, the method including: forming an element layer on a substrate which is divided into a pixel array area and a bonding pad area; forming a bonding pad on the bonding pad area of the element layer; forming a passivation layer covering the bonding pad on the element layer; partially etching the passivation layer on the bonding pad to form a partially remaining passivation layer such that the bonding pad is not exposed; forming a color filter layer on the pixel array area of the passivation layer; forming an overcoating layer on the color filter layer; forming at least two micro lenses on the overcoating layer; and etching the partially remaining passivation layer exposing the bonding pad.

In another aspect of the present invention, there is provided an image sensor including: an overcoating layer; and at least two micro lenses formed on the overcoating layer, wherein the overcoating layer positioned below a clearance between the micro lenses is etched such that curved surfaces of the micro lenses extend to the etched overcoating layer.

In another aspect of the present invention, there is provided an image sensor including: at least two micro lenses; and a non-fluid film filling a clearance between the micro lenses adjacent to each other and formed on the micro lenses.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
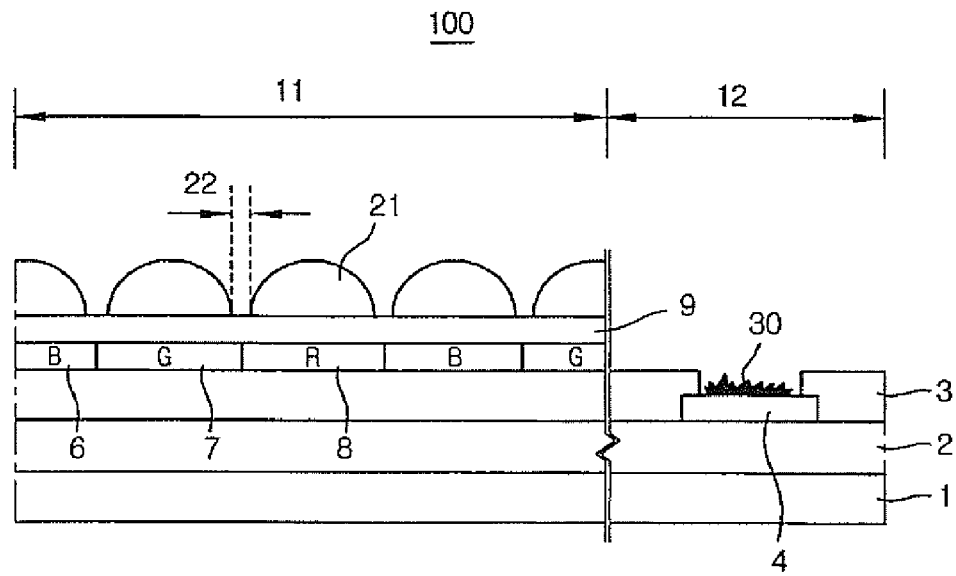
FIG. 1 is a schematic sectional view of an image sensor according to the related art.
Figure 2:
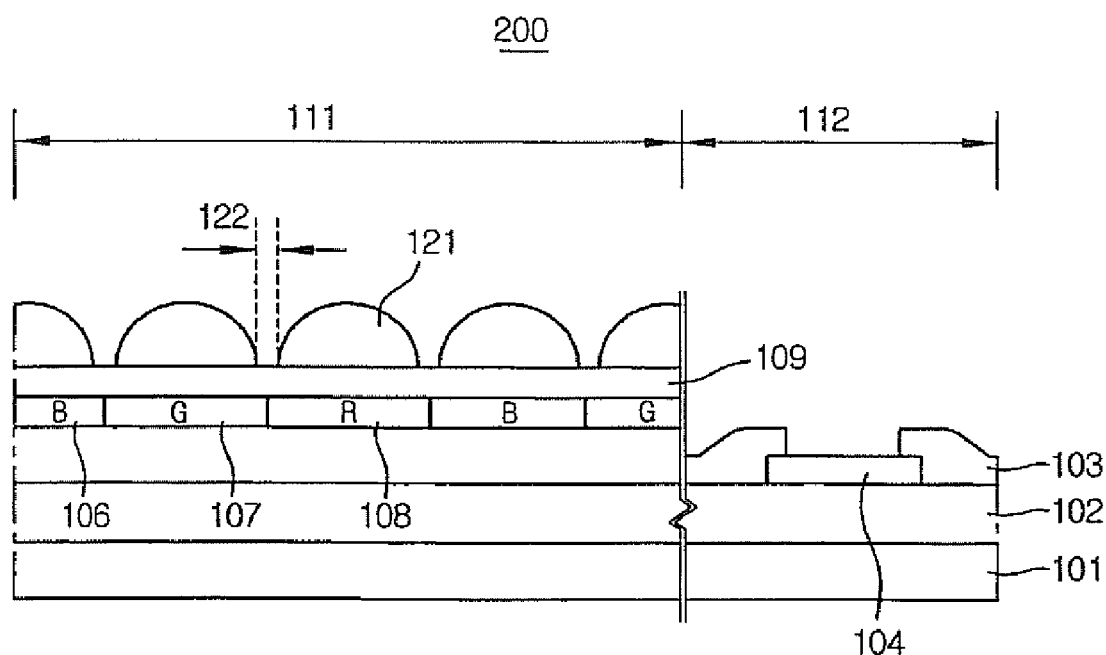
FIG. 2 is a schematic sectional view of an image sensor to which a method of fabricating the image sensor according to a first embodiment of the present invention is applied.

FIG. 2 is a schematic sectional view of an image sensor 200 to which a method of fabricating the image sensor according to a first embodiment of the present invention is applied, and omits a photodiode and the like.

The image sensor 200 according to a first embodiment of the present invention is characterized in that the image sensor 200 includes an overcoating layer 109 and at least two micro lenses 121, and the overcoating layer 109 positioned below a clearance between the micro lenses 121 is etched and curved surfaces of the micro lenses 121 extend.

At this time, the image sensor 200 is characterized by including a substrate 101 divided into a pixel array area 111 and a bonding pad area 112, an element layer 102 formed on the substrate 101, a bonding pad 104 formed on a bonding pad area of the element layer 102, a passivation layer 103 covering the bonding pad 104 and formed on the element layer 102, color filter layer including a plurality of color filter patterns 106, 107, 108 sequentially formed on the pixel array area 111 of the passivation layer 103, an overcoating layer 109 formed on the color filter layer 106, 107, 108, micro lenses 121 formed on the overcoating layer 121. The color filter layer 106, 107, 108 can include blue color filter pattern 106, green color filter pattern 107, and red color filter pattern 108.

A method of fabricating the image sensor according to a first embodiment of the present invention will now be described with reference to FIGS. 3 through 5.

Figure 3:
FIGS. 3 through 5 are sectional views illustrating a method of fabricating an image sensor according to a first embodiment of the present invention.
Figure 3:
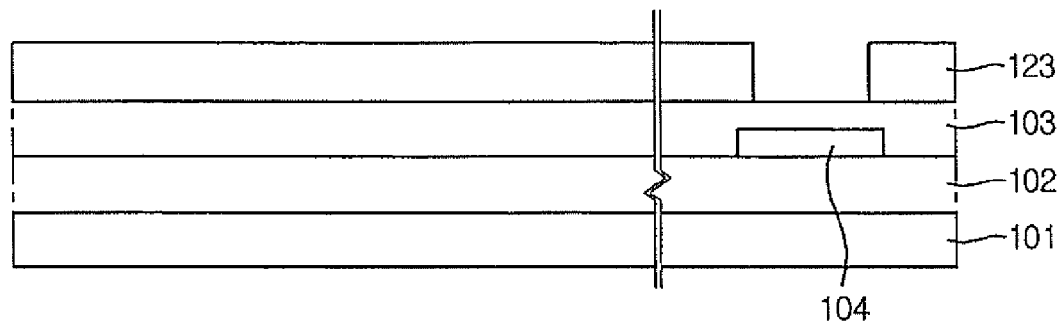
Figure 4:
Figure 4:
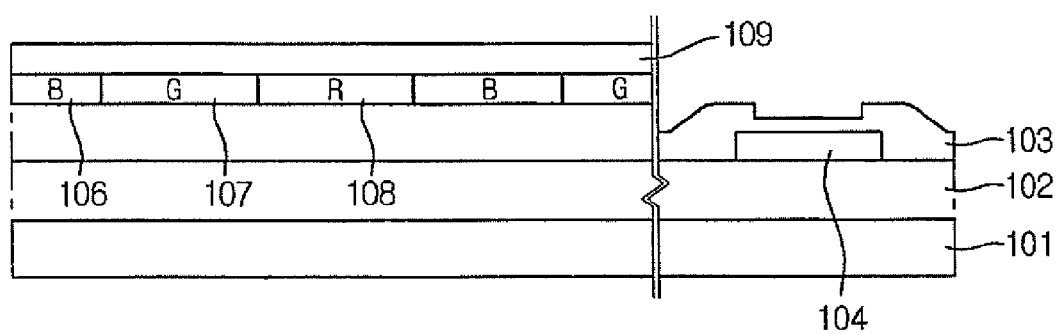

First, referring to FIG. 3, an element layer 102 is formed on a substrate 101, which is divided into a pixel array area 111 and a bonding pad area 112. The element layer 102 can include a photo detector region, a gate electrode, an interlayer insulating layer, a metal interconnection line and the like.

Next, a bonding pad 104 is formed on the bonding pad area 112 of the element layer 102.

Next, a passivation layer 103 is formed on the element layer so as to cover the bonding pad 104. A photoresist film 123 is coated on the passivation layer 103, is exposed to light and developed to form a photoresist pattern 123 for etching the bonding pad area 112 of the passivation layer Next, referring to FIG. 4, the passivation layer 103 on the bonding pad 104 is selectively etched to form a partially remaining passivation layer 103 such that the bonding pad 104 is not exposed. Herein, the partially remaining passivation layer 103 may be 500 Å to 2,000 Å thick.

Next, blue (B) color filter pattern 106, green (G) color filter pattern 107 and red (R) color filter pattern 108 are sequentially formed on the pixel array area 111 of the passivation layer 103. Alternatively, the color filter patterns may be formed in the colors of yellow, magenta and cyan. An overcoating 109 is formed on the color filter patterns 106, 107, 108.

Figure 5:
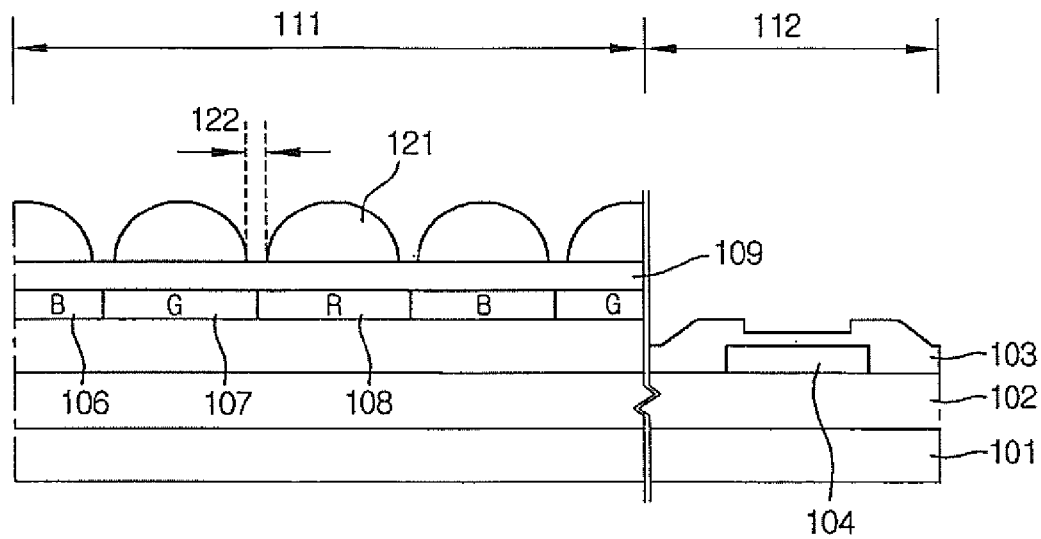

Next, referring to FIG. 5, a plurality of micro lenses 121 are formed on the overcoating layer 109. The plurality of micro lenses 121 are formed in the shape of domes by forming a lens pattern of a photoresist film on the overcoating layer 109, performing a bleaching process step with respect to the lens pattern of the photoresist film, and performing a first flow process step. At this time, a clearance 122 is generated between the micro lenses 121 and 121. It is preferable that the micro lenses 121 formed on the overcoating layer have a clearance ranging from 0.5 μm to 1.0 μm. If the clearance is less than 0.5 μm, a bridge phenomenon that the micro lenses 121 are adhered to each other may be caused.

Next, the partially remaining passivation layer 103 contacting the bonding pad 104 is etched, as shown in FIG. 2.

By the above method, the image sensor 200 according to the first embodiment of the present invention is completed. Subsequently, an additional process step may be performed.

In the image sensor 200 according to the first embodiment of the present invention, unlike in the related art, the passivation layer 103 is etched to form the partially remaining passivation layer such that the bonding pad 104 is not exposed. Thereafter, by the consecutive photomasking process steps, the color filter layer 106, 107, 108, the overcoating layer 109, and the micro lenses 121 are formed.

Hence, in the image sensor 200 according to the first embodiment of the present invention, since the bonding pad 104 is not eroded by alkaline developer due to the partially remaining passivation layer 103, the hardening of the Al bonding pad is prevented and an image fail of the image sensor due to metal particles that may be generated during a probing test can be further prevented.

Figure 6:
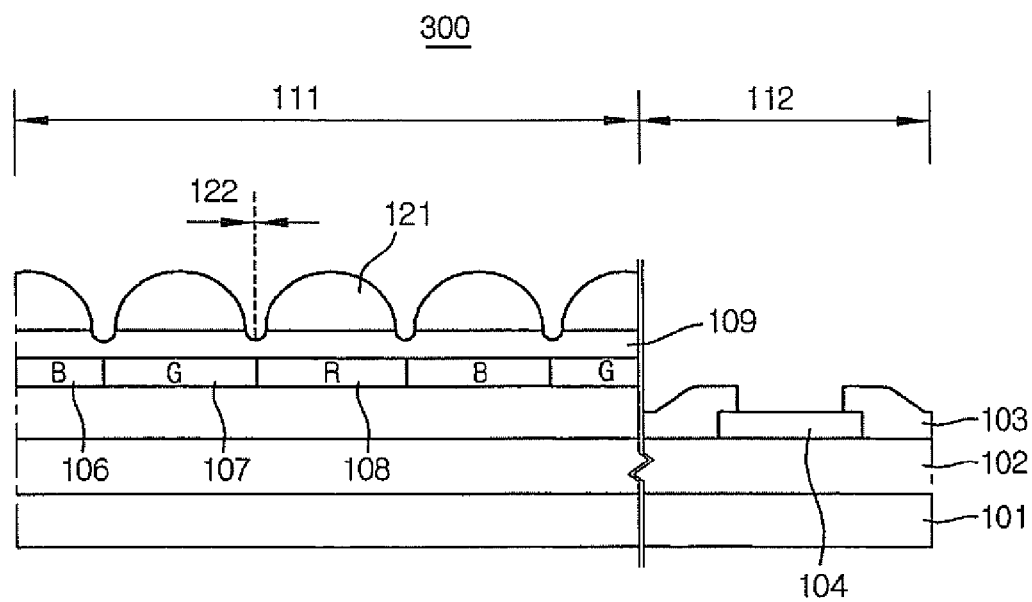
FIG. 6 is a schematic sectional view of an image sensor according to a second embodiment of the present invention.

FIG. 6 is a schematic sectional view of an image sensor 300 according to a second embodiment of the present invention, and omits a photodiode and the like.

The image sensor 300 according to a second embodiment of the present invention is characterized in that the image sensor 300 includes an overcoating layer 109 and at least two micro lenses 121, and the overcoating layer 109 positioned below a clearance between the micro lenses 121 is etched and curved surfaces of the micro lenses 121 extend.

The image sensor 300 according to the second embodiment of the present invention is different from that according to the first embodiment in that while the partially remaining passivation layer 103 is etched, the overcoating layer 109 positioned below the clearance between the micro lenses 121 is etched such that the surfaces of the micro lenses 121 extend.

A method of fabricating the image sensor 300 according to the second embodiment of the present invention will now be described with reference to FIG. 6.

The fabrication method of the image sensor 300 according to the second embodiment is the same as that according to the first embodiment until the micro lenses 121 are formed on the overcoating layer 109.

In a subsequent process step, the partially remaining passivation layer 103 contacting the bonding pad is etched and at the same time the overcoating layer positioned below the clearance between the micro lenses 121 is etched such that the curved surfaces of the micro lenses 121 extend.

Next, if a second flow process step for the micro lenses 121 is performed, the curved surfaces of the micro lenses 121 extend so that the micro lenses 121 and the overcoating layer of the etched portions function as lenses.

Meanwhile, the process step of etching the overcoating layer 109 positioned below the clearance 122 may be performed before or after the process step of etching the partially remaining passivation layer 103.

By the above method, the image sensor 300 according to the second embodiment of the present invention is completed. Subsequently, an additional process step may be performed.

The image sensor 300 according to the second embodiment of the present invention extends the curved surfaces of the micro lenses to a clearance of boundaries of the color filter patterns such that light incident into the boundaries can be induced to the photodiode, thereby improving the concentration efficiency.

Also, in the image sensor 300 according to the second embodiment of the present invention, since the bonding pad 104 is not eroded by alkaline developer due to the partially remaining passivation layer 103, the hardening of the Al bonding pad is prevented and an image fail of the image sensor due to metal particles that may be generated during a probing test can be further prevented.

Figure 7:
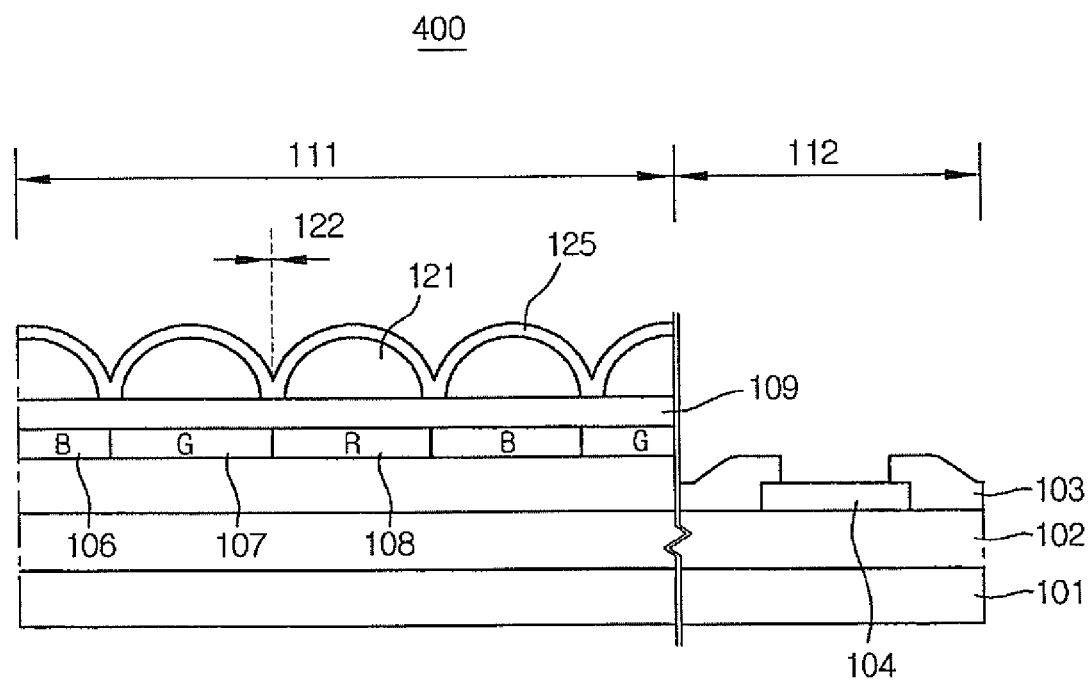
FIG. 7 is a schematic sectional view of an image sensor according to a third embodiment of the present invention.

FIG. 7 is a schematic sectional view of an image sensor 400 according to a third embodiment of the present invention, and omits a photodiode and the like.

The image sensor 400 according to the third embodiment of the present invention is characterized by including at least two micro lenses 121 and a non-fluid film 125 filling a clearance between the adjacent micro lenses 121 and formed on the at least two micro lenses 121.

Comparing the image sensor 400 according to the third embodiment with the image sensor 200 according to the first embodiment, the image sensor 400 is different from the image sensor 200 in that the image sensor 400 includes the non-fluid film 125 which fills the clearance between the adjacent micro lenses 121, has a greater refractivity than the micro lenses 121 and is formed on the micro lenses 121.

The fabrication method of the image sensor 400 according to the third embodiment is the same as that according to the first embodiment until the micro lenses 121 are formed on the overcoating layer 109.

In a subsequent process step, the non-fluid film 125, which fills the clearance between the adjacent micro lenses 121 and has a greater refractivity than the micro lenses 121, is formed on the micro lenses 121. The non-fluid film 125 may be an inorganic insulator film, such as an inorganic oxide nitride film, an inorganic oxide film, an inorganic nitride film.

Next, the partially remaining passivation layer 103 contacting the bonding pad 104 is etched.

Alternatively, the process step of forming the non-fluid film 125 may be performed after the partially remaining passivation layer 103 is etched.

By the above method, the image sensor 400 according to the third embodiment of the present invention is completed. Subsequently, an additional process step may be performed.

The image sensor 400 according to the third embodiment of the present invention concentrates the light leaked through the clearance between the micro lenses 121 on a light receiving region to enhance the concentration efficiency of the image sensor.

Also, in the image sensor 400 according to the third embodiment of the present invention, since the bonding pad 104 is not eroded by alkaline developer due to the partially remaining passivation layer 103, the hardening of the Al bonding pad is prevented and an image fail of the image sensor due to metal particles that may be generated during a probing test can be further prevented.

It will be apparent to those skilled in the art that various modifications and variations can be made in the present invention. Thus, it is intended that the present invention covers the modifications and variations of this invention provided they come within the scope of the appended claims and their equivalents.

In other words, the image sensor and the method of fabricating the image sensor according to the present invention can be applied to all kinds of image sensors having a contamination problem of the bonding pad and for enhancing the concentration efficiency, such as CCD-type image sensors, CMOS-type image sensors and the like.

What is claimed is:

1. An image sensor comprising:
    an overcoating layer; and
    at least two micro lenses formed on the overcoating layer using a flow process,
    wherein the overcoating layer positioned below a clearance between the micro lenses is etched such that curved surfaces of the micro lenses extend to the etched overcoating layer, and
    wherein the micro lenses are formed using the flow process such that an overflowed substance is not formed on the etched overcoating layer.

2. The image sensor of claim 1, wherein the image sensor comprises:
    a substrate divided into a pixel array area and a bonding pad area;
    an element layer formed on the substrate;
    a bonding pad formed on the bonding pad area of the element layer;
    a passivation layer covering the bonding pad and formed on the element layer of the substrate; and
    a color filter layer including a plurality of color filter patterns sequentially formed on the pixel array area of the passivation layer;
    wherein the overcoating layer is formed on the color filter layer and the at least two micro lenses are formed on the overcoating layer.

3. The image sensor of claim 1, wherein the micro lenses are formed at an interval range of 0.5-1.0 μm.

* * * * *